(12) United States Patent
Hutchison et al.

(10) Patent No.: US 6,507,494 B1
(45) Date of Patent: Jan. 14, 2003

(54) ELECTRONIC EQUIPMENT ENCLOSURE

(75) Inventors: Randall D. Hutchison, Shawnee, KS (US); Robert Schiffbauer, Olathe, KS (US)

(73) Assignee: ADC Telecommunications, Inc., Eden Prairie, MN (US)

( * ) Notice: Subject to any disclaimer, the term of this patent is extended or adjusted under 35 U.S.C. 154(b) by 0 days.

(21) Appl. No.: 09/916,520

(22) Filed: Jul. 27, 2001

Related U.S. Application Data
(60) Provisional application No. 60/221,235, filed on Jul. 27, 2000, and provisional application No. 60/221,234, filed on Jul. 27, 2000.

(51) Int. Cl.[7] .................................................. H05K 7/20
(52) U.S. Cl. ....................................... 361/704; 361/710
(58) Field of Search ................................ 361/118, 119, 361/679, 687, 688, 701, 704, 709, 710

(56) References Cited

U.S. PATENT DOCUMENTS

| | | |
|---|---|---|
| 4,449,576 A | 5/1984 | Baum et al. |
| 4,465,899 A | 8/1984 | Mauclere et al. |
| 4,528,615 A | 7/1985 | Perry |
| 4,679,250 A | 7/1987 | Davis et al. |
| 4,858,068 A | 8/1989 | Bitller et al. |
| 4,962,445 A | 10/1990 | Pelet et al. |
| 5,060,115 A | 10/1991 | Sewell |
| 5,105,337 A | 4/1992 | Bitller et al. |
| 5,251,099 A | 10/1993 | Goss et al. |
| 5,329,425 A | 7/1994 | Leyssens et al. |
| 5,343,358 A | 8/1994 | Hilbrink |
| 5,777,846 A | 7/1998 | Hayes et al. |
| 5,842,514 A | 12/1998 | Zapach et al. |
| 5,844,777 A | 12/1998 | Gates |
| 5,883,784 A | 3/1999 | Hughes et al. |
| 5,896,268 A | 4/1999 | Beavers |
| 5,930,113 A | 7/1999 | McCann |
| 5,943,219 A | 8/1999 | Bellino et al. |
| 5,949,650 A | 9/1999 | Bulante et al. |
| 6,025,991 A | 2/2000 | Saito |
| 6,028,769 A | 2/2000 | Zurek |
| 6,046,908 A | 4/2000 | Feng |
| 6,055,157 A | 4/2000 | Bartilson |
| 6,104,611 A | 8/2000 | Glover et al. |
| 6,244,332 B1 | 6/2001 | Gesklin et al. |
| 6,252,775 B1 | 6/2001 | Kuroda |
| 6,292,556 B1 | 9/2001 | Laetsch |

FOREIGN PATENT DOCUMENTS

| | | | |
|---|---|---|---|
| GB | 2193552 | 2/1988 | ............ H04B/9/00 |
| JP | 57102058 | 6/1982 | ............ H01L/23/34 |
| JP | 6079834 | 5/1985 | ............ H04B/3/02 |
| JP | 865868 | 3/1996 | ............ H02G/9/02 |

OTHER PUBLICATIONS

Thermacore Inc. sales brochure, "heat pipes for electronics cooling applications", 4 page, No Date.
Thermacore Inc. Product Data Guide, "Miniature Heat Pipes," Sep. 24, 1996, 1 page.
Thermacore Inc. brochure, "Common Questions About Heath Pipes," Sep. 23, 1996, 2 pages.
Thermacore Inc. sales brochure, "The Leader in Heath Pipe Technology", 4 pages, No Date.

*Primary Examiner*—Edward H. Tso
(74) *Attorney, Agent, or Firm*—Hovey Williams LLP (57) ABSTRACT

An electronic equipment enclosure (10) for housing electronic equipment (11), and broadly comprising a pivot bracket (22); a plurality of sleeves (24), each being associated with a transmit terminal (26), a receive terminal (28), protective circuitry (30), and test circuitry (32); a spreader plate (38); and a heat sink (40). The pivot bracket (22) allows for tilting an outer housing (12) up to 30° relative to a mounting surface. The separate and distinct transmit and receive terminals (26,28) maintain minimum cross-talk and interference levels. The protective and the test circuitries (30,32) are located on daughter boards adjacent each sleeve (24) so as to be easily accessible. The spreader plate (38) is operable to force the sleeves (24) into direct contact with the interior surface of the outer housing (18). The heat sink (40) is operable to facilitate conductive heat transfer between the sleeves (24) and the lid (18).

59 Claims, 5 Drawing Sheets

ELECTRONIC EQUIPMENT ENCLOSURE

RELATED APPLICATIONS

This application claims priority benefit, with regard to all common subject matter, of a provisional application titled. "Enclosure for Telecommunications Equipment", Serial No. 60/221,235, filed Jul. 27, 2000 and to provisional application No. 60/221,234 file Jul. 27, 2000.

BACKGROUND OF THE INVENTION

1. Field of the Invention

The present invention relates to electronic equipment enclosures for housing telecommunications, signaling, and other similar electronic equipment. More particularly, the present invention relates to such an electronic equipment enclosure which provides a greater range of possible mounting orientations and an ability to pivot or tilt while mounted; reduces crosstalk through separation of transmit and receive terminals; allows for convenient top access to both protective circuitry and test circuitry; provides improved pathways for thermal conduction, as well as other heat dissipation features; and prevents inadvertent disengagement of the electronic equipment due, for example, to movement or rough handling of the equipment enclosure.

2. Description of the Prior Art

It is often necessary to house telecommunications, signaling, and other similar electronic equipment in protective electronic equipment enclosures so that the equipment may be located where needed, often in relatively harsh operating environments such as mounted on telephone poles or within subterranean manholes. Thus, these equipment enclosures must be designed to protect the electronic equipment from environmental hazards, such as sun, moisture, dust, and debris, as well as damage from vandalism and attempted theft.

For example, ever-increasing use of wide area networks (WANs), particularly the Internet, and other telecommunication innovations has increased ISDN, (X)DSL, and T1, in homes and businesses. Due to signal propagation limitations, these digital services require special electronic equipment, including repeaters and doublers, to regenerate signals when end users are too far from a provider's central office. Thus, it is important that the equipment enclosures safely and securely house multiple repeater units or "cards" or other similar electronic equipment in a space efficient manner.

Unfortunately, many prior art equipment enclosures suffer from a number of disadvantages, including being undesirably limited with regard to possible mounting orientations, and an inability to maneuver the mounted equipment enclosure for easier access to the interior thereof. Furthermore, the prior art suffers from undesirable crosstalk and other interference problems due to interfering transmit and receive wires. One known solution to this latter problem is to twist the transmit and receive wires about one another at a rate of approximately two twists per inch, thereby substantially eliminating the interfering electromagnetic fields generated by the wires. Additionally, many prior art equipment enclosures do not provide for convenient access to either protective circuitry, such as lightning surge protection circuitry, or test circuitry, often requiring that a substantial portion of the electronic equipment be removed or its function otherwise disrupted in order to access one or both circuitries.

It is also important that the equipment enclosure facilitate dissipation of potentially damaging levels of heat generated by the operating electronic equipment. Electricity to power fans or other artificial cooling means is typically not available to the equipment enclosures and so dissipation of heat that can reach temperatures over 200° F. must be accomplished through natural conduction and convection to ambient air. Such passive heat dissipation has become increasingly more difficult, however, as the electronic equipment has become faster, more powerful, and smaller, thereby generating greater amounts of potentially damaging heat in increasingly confined or sun-exposed operating environments. Unfortunately, another problem with existing equipment enclosure designs is that they do not make the most efficient use of natural cooling mechanisms. For example, in many prior art equipment enclosures, cooling problems are exacerbated by repeater card arrangements that retain generated heat and, furthermore, transfer the generated heat between adjacent cards and other electronic equipment rather than to the surrounding environment. Many such equipment enclosures attempt to compensate with complex mechanical linkage assemblies meant to provide a continuous pathway for thermal conduction to the ambient environment. Unfortunately, such mechanical linkages are typically expensive to manufacture, difficult to use, and undesirably increase the size and weight of the equipment enclosures.

Additionally, it is desirable that the electronic equipment be readily accessible and conveniently removable without being prone to inadvertent disengagement during, for example, movement or rough handling of the equipment enclosure. A variety of retaining mechanisms are known in the art, most of which include an actuatable or removable mechanism associated with each piece of electronic equipment. Unfortunately, though preventing inadvertent disengagement of the electronic equipment, these existing mechanisms typically result in additional time and labor required to remove the electronic equipment when desired.

Due to the above-identified and other problems and disadvantages in the prior art, a need exists for an improved electronic equipment enclosure.

SUMMARY OF THE INVENTION

The present invention solves the above-described and other problems and disadvantages to provide a distinct advance in the art of electronic equipment enclosures. More particularly, the present invention provides an electronic equipment enclosure for housing electronic equipment, such as, for example, telecommunications, signaling, and other similar electronic equipment, wherein the equipment enclosure provides a number of advantages over the prior art, including more effectively dissipating excess heat, thereby prolonging the life of the electronic equipment and preventing premature failure thereof due to damaging levels of retained, internally generated heat. This is accomplished in part by providing improved pathways for thermal conduction without use of complex, expensive, and heavy mechanical linkage assemblies found in the prior art.

In a preferred embodiment, the enclosure comprises an outer housing; a mounting bracket; a pivot bracket; a plurality of sleeves, with each sleeve being associated with a plurality of transmit terminals, a plurality of receive terminals, protective circuitry, and test circuitry; a spreader plate; and a heat sink or card retainer. The stainless steel outer housing is operable to internally house and protect the electronic equipment from environmental hazards as well as damage from vandalism and attempted theft. The outer housing further provides mounting and interface structures for coupling with the mounting bracket or the pivot bracket; a cable connector, cable interface, or interface block; and, where appropriate, pressurization controls. The mounting bracket is operable to removably secure the outer housing to a mounting structure or surface, such as, for example, a telephone pole, a building wall, or a wall or other surface within a subterranean manhole. The pivot bracket is interposable between the outer housing and the mounting bracket, being pivotably or hingedly coupled with one and fixedly coupled with the other, to allow the outer housing to be tilted up to 30° relative to the mounting bracket, thereby both facilitating access and allowing for a greater variety of mounting locations and orientations.

The plurality of sleeves are operable to receive, retain, and interface the electronic equipment. Although not limited to housing telecommunications equipment, the equipment enclosure as described herein includes eight sleeves, each operable to house one double-wide repeater card or, with a sleeve-bisecting insert in place, two single-wide repeater cards.

The transmit and receive terminals couple with transmit and receive wires to, respectively, transmit and receive signals to and from a pendant cable. Within the pendant cable, the transmit and receive wires are separated and shielded from one another in order to reduce cross-talk or other interference. In the prior art, the transmit and receive terminals were combined in a single interface connector, thereby necessitating that the transmit and receive wires be twisted in order to maintain minimum cross-talk levels between the wires. It will be appreciated that, being labor intensive and time-consuming, such wire twisting is undesirably inconvenient and inefficient. In the present invention, however, the transmit and receive terminals are separate and distinct, thereby advantageously maintaining minimum cross-talk levels without twisting wires.

The protective circuitry, commonly including gas tube lightning surge protection circuitry, is operable to provide electrical protection for the electronic equipment. The protective circuitry is mounted on removable circuit boards, or "daughter boards", which are located adjacent to each sleeve, and is easily accessible after removing only a lid portion of the outer housing. Thus, in contrast to the prior art, it is advantageously unnecessary to remove or otherwise interfere with operation of either the sleeves or the electronic equipment when accessing or removing and replacing the circuit boards containing the protective circuitry.

The test circuitry is operable to provide test pins or similar electrical connections for testing the operation of some or all of the electronic equipment. The test circuitry is also mounted on circuit boards, or "daughter boards", and is easily accessible after removing only a lid portion of the outer housing. The test circuitry may include bantam jacks for advantageously facilitating easier interfacing of test equipment with the test circuitry.

The spreader plate is operable to physically force the sleeves into direct contact with the interior wall of the outer housing, thereby ensuring a direct pathway for thermal conduction from the heat-generating electronic equipment to the outer housing and the ambient environment.

The heat sink, including an upper contact surface and a plurality of leg portions depending therefrom, is advantageously operable to improve conductive heat transfer between the sleeves and the lid by providing a pathway for thermal conductivity therebetween, and is further operable to aid in retaining the electronic equipment in its proper operating position within the sleeves. In operation, waste heat generated by the electronic equipment is transferred to the legs of the heat sink (or to the sleeves and thereafter to the legs) then to the upper contact surface and then to the lid wherefrom it may be radiated into the ambient environment.

The card retainer, including a body and a plurality of leg portions depending therefrom, is advantageously operable to protect against inadvertent disengagement of the electronic equipment from the sleeves. The body secures to or is incorporated into the lid such that, when the lid is closed, each depending leg portion contacts the electronic equipment engaged within a corresponding sleeve, thereby preventing inadvertent disengagement due, for example, to movement or rough handling of the equipment enclosure. The card retainer, being secured to the lid, is removed with the lid such that no additional work is required to remove the electronic equipment from the sleeves. The card retainer may be included alternative to or in combination with the heat sink.

Thus, the equipment enclosure of the present invention provides a number of advantages, including the pivot bracket which provides an advantageous ability to pivot the outer housing up to 30° relative to the mounting bracket, thereby both facilitating access and allowing for a greater variety of mounting locations and orientations than was possible in the prior art. Furthermore, the feature of separate and distinct transmit and receive terminals advantageously maintains minimum cross-talk and interference levels without the requiring that the transmit and receive wires be inconveniently and inefficiently twisted, as was required in the prior art. Additionally, the protective circuitry and the test circuitry is located on daughter boards adjacent the each sleeve so as to be advantageously accessible after removing only a lid portion of the outer housing, unlike the prior art which required that the repeater cards be removed or that the operation of the electronic equipment be otherwise interfered with in order to access one or both circuitries. Additionally, heat dissipation through natural conduction is advantageously improved by the spreader plate, which is operable to force the sleeves into direct contact with the interior wall of the outer housing, unlike the prior art which used complex, failure prone, and costly mechanical linkages to provide indirect contact. Heat dissipation is also advantageously improved by the heat sink which facilitates conductive heat transfer between the sleeves and the lid.

These and other features of the present invention are more fully described below in the section entitled DETAILED DESCRIPTION OF A PREFERRED EMBODIMENT.

BRIEF DESCRIPTION OF THE DRAWING FIGURES

A preferred embodiment of the present invention is described in detail below with reference to the attached drawing figures, wherein.

DETAILED DESCRIPTION OF A PREFERRED EMBODIMENT

Figure 1:
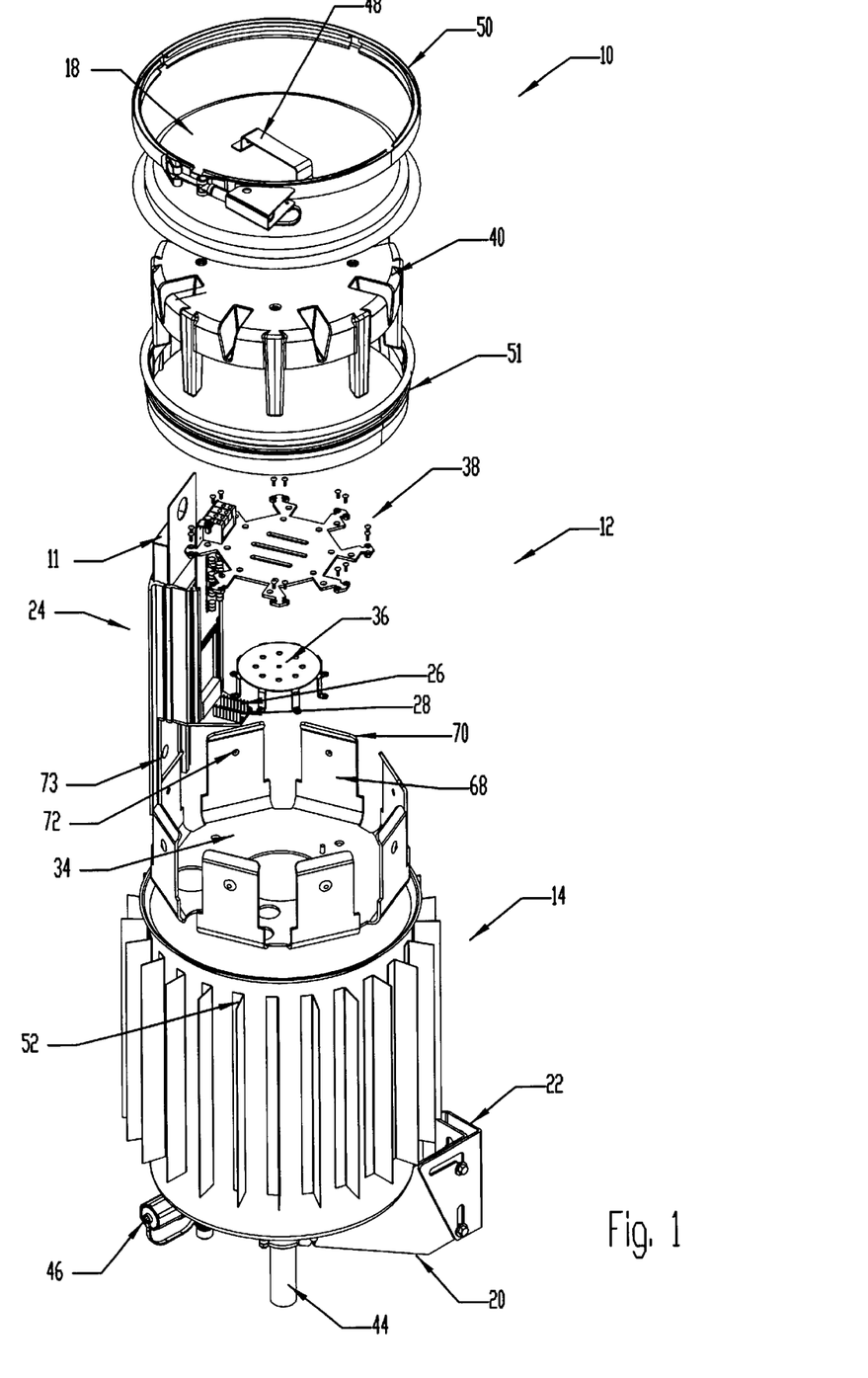
FIG. 1 is an exploded isometric view of a preferred first embodiment of the electronic equipment enclosure of the present invention.
Figure 4:
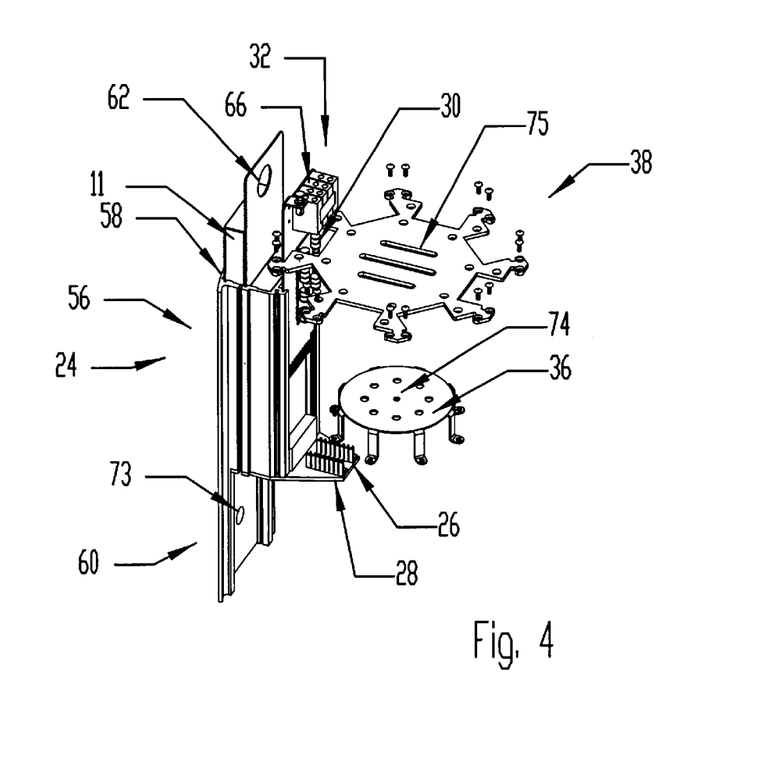
FIG. 4 is an exploded isometric view of a sleeve portion and sleeve spreader portion of the present invention.

Referring to FIGS. 1 and 4, an electronic equipment enclosure 10 is shown constructed in accordance with a preferred first embodiment of the present invention, and operable to protectively house electronic equipment 11, including telecommunications, signaling, and other similar electronic equipment, such as, for example, signal repeater and doubler cards, and further operable to advantageously provide a greater range of possible mounting orientations; reduce crosstalk through separation of transmit and receive terminals; allow for convenient top access to both protective circuitry and test circuitry; provide improved pathways for thermal conduction, as well as other heat dissipation features; and prevent inadvertent disengagement of the electronic equipment due, for example, to movement or rough handling of the equipment enclosure. The preferred equipment enclosure 10 broadly comprises an outer housing 12, including a body 14 and a lid 18; a mounting bracket 20; a pivot bracket 22; a plurality of sleeves 24, with each sleeve 24 being associated with a plurality of transmit terminals 26, a plurality of receive terminals 28, protective circuitry 30, and test circuitry 32; a base plate 34; a ground plate 36; a spreader plate 38; and a heat sink 40 or card retainer 41.

The outer housing 12 is operable to house and protect the electronic equipment 11 from environmental hazards as well as damage from vandalism and attempted theft. The outer housing 12 broadly includes the body 14 and the lid 18, all of which may be constructed of 316L stainless steel or similar material. As illustrated, the body 14 is substantially cylindrical, with an open top and a bottom presenting various openings for cable entry and air controls. The bottom of the body 14 also provides mounting and interface structures for receiving the mounting bracket 20 or pivot bracket 22; a cable connector, cable interface, or interface block operable to couple with a pendant cable 44; and, where appropriate, pressurization controls or an order wire connector 46. For example, a universal air valve 47 (see FIG. 2), such as is disclosed in a copending provisional patent application titled "Universal Air Control Valve/Air Control Device", Serial No. 60/277,137, filed Mar. 19, 2001, may be secured to or incorporated into the bottom of the body 14.

The lid 18 operates to removably substantially seal the open top of the body 14, thereby protecting the electronic equipment 11 and other contents from various environmental conditions, including dust, moisture, and wildlife, while providing a convenient means of accessing the contents located therein. The lid 18 preferably includes a handle portion 48 for convenient use.

As illustrated, the lid 18 is shown securely fastened to the housing 12 by a common ring clamp 50 expandable to fit over a lid/housing interface including an O-ring seal 51, and compressible to tightly engage both lid 18 and body 14 and prevent relative movement therebetween. Expansion and compression of the ring clamp 50 may be accomplished by a levered, threaded, or other mechanism, as is well known.

Figure 2:
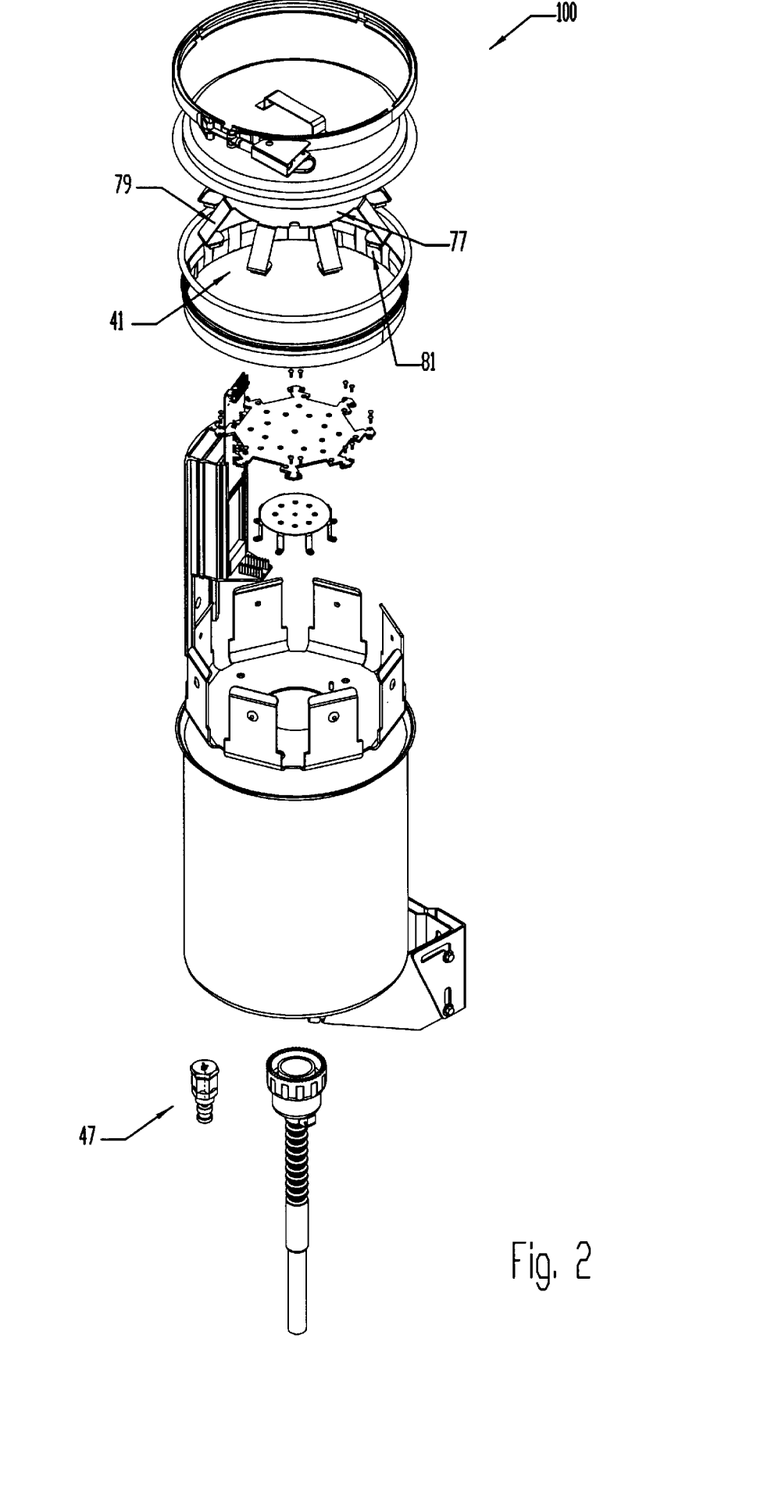
FIG. 2 is an exploded isometric view of a preferred second embodiment of the electronic equipment enclosure of the present invention.

A preferred second embodiment of the equipment enclosure 100 is shown in FIG. 2 in order to illustrate that the shape, construction, and other specific features of the equipment enclosure will depend greatly on a variety of factors, including, for example, mounting location, operating environment, and the nature of the electronic equipment 11. Thus, for example, the equipment enclosure 10 of FIG. 1 is adapted for above-ground mounting, such as on telephone poles or building walls, as is evidenced by the addition of heat dissipation fins 52 secured to the outer housing 12 and operable to further facilitate dissipation of internally-generated heat into the ambient environment. Furthermore, equipment enclosures 10 mounted above-ground are preferably painted or otherwise colored white or a similar substantially light-reflective color in order to reduce effects of solar loading. The equipment enclosure 100 of FIG. 2 may be mounted below ground, such as in a manhole, and is preferably internally pressurized due to increased exposure to condensation, moisture laden air, and flooding, and needs neither heat dissipation fins nor white paint as solar loading is not a concern.

Referring again to FIG. 1, the mounting bracket 20 is operable to removably secure the outer housing 12 either vertically or horizontally to a mounting structure or surface, such as, for example, a telephone pole, a building wall, or a wall or other surface within a subterranean manhole. As illustrated, the mounting bracket 20 removably couples, using threaded studs, with the body 14 of the outer housing 12. The mounting bracket 20 may be specially adapted to accommodate a desired mounting orientation, whether vertical or horizontal, or the particular shape or construction of the mounting structure or surface.

Figure 3:
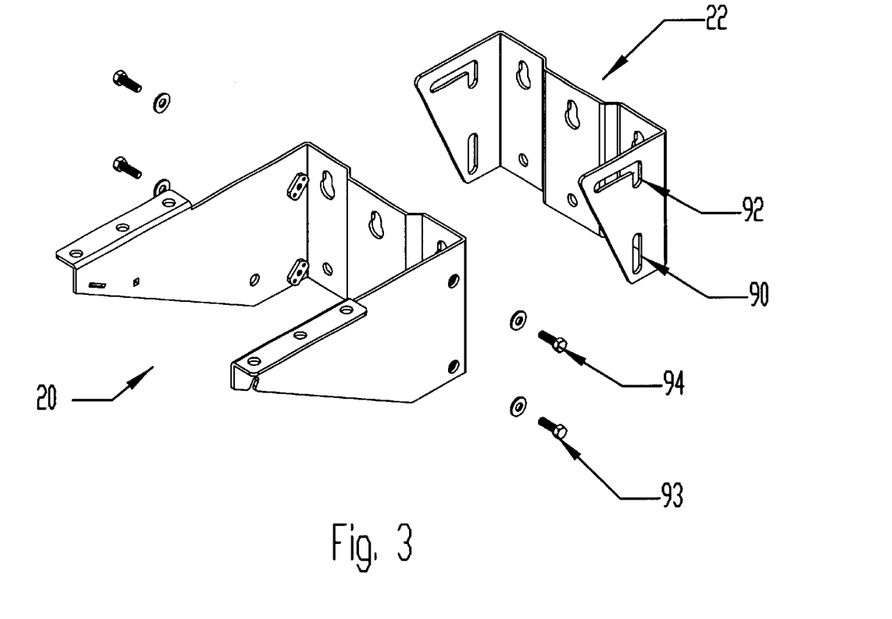
FIG. 3 is an exploded isometric view of a pivot bracket portion of the present invention.

Referring also to FIG. 3, the pivot bracket 22 is pivotably or hingedly interposed between the mounting surface and the mounting bracket 20 to allow the outer housing 12 to be tilted up to 30° relative to the mounting surface, thereby both facilitating access and allowing for a greater variety of mounting locations and orientations. FIG. 3 illustrates one possible mechanism for accomplishing this feature wherein the pivot bracket 22 is provided with left and right pivot points 90 and left and right pivot channels 92. In operation, in order to tilt the equipment enclosure 10, with the mounting bracket 20 having been previously secured with lower and upper bolts 93,94 to, respectively, the pivot points 90 and pivot channels 92, the lower bolts 93 are loosened so that they may pivot within the pivot points 90 and the upper bolts 94 are loosened so that they may move substantially horizontally or curvedly within the pivot channels 92. This combination of pivot and movement allows the enclosure 10 to be safely tilted to a degree determined by the length of the pivot channels 92. It will be appreciated by those with skill in the mechanical arts that a variety of alternative mechanisms may be devised which to implement the advantageous tilting feature of the present invention.

The plurality of sleeves 24 are operable to receive, engage, and interface the electronic equipment 11. Each sleeve 24 comprises an upper portion 56, which includes one or more generally rectangular card-receiving slots 58, and a lower leg portion 60. Although not limited to housing telecommunications equipment or to a particular number of sleeves 24, in the illustrated embodiment the equipment enclosure 10 includes eight sleeves 24, with each card-receiving slot 58 being operable to house one double-wide repeater card or, with a sleeve-bisecting insert 62 in place, two single-wide repeater cards. The sleeves 24 are preferably constructed of aluminum, which has high thermal conductivity, but may alternatively be constructed of any similarly suitable material. Additionally, thermal paste may be applied to the sleeves 24 in order to further enhance thermal conductivity.

Each sleeve 24 is preferably associated with the transmit terminals 26; the receive terminals 28; the protective circuitry 30; and the test circuitry 32. The transmit and receive terminals 26,28 couple with transmit and receive wires (not shown) to, respectively, transmit and receive signals to and from the pendant cable 44. Within the pendant cable 44, the transmit and receive wires are separated and shielded from one another in order to reduce cross-talk or other interference. In the prior art, the transmit and receive terminals 26,28 were combined in a single interface connector, thereby necessitating that the transmit and receive wires be twisted in order to maintain minimum cross-talk levels between the wires. It will be appreciated that, being labor intensive and time-consuming, such wire twisting is undesirably inconvenient and inefficient. In the present invention, however, the transmit and receive terminals 26,28 are separate and distinct, thereby advantageously maintaining minimum cross-talk levels without twisting wires.

The protective circuitry 30 is operable to provide electrical protection for the electronic equipment 11. Thus, for example, the protective circuitry 30 will commonly include gas tube lightning surge protection circuitry. The protective circuitry 30 is mounted on removable circuit boards, or "daughter boards", which are located adjacent the sleeves 24, electrically connected with the electronic equipment 11, and easily accessed through the top of the outer housing 12 with only the lid 18 removed. Thus, in contrast to the prior art, it is advantageously unnecessary to remove or otherwise interrupt or interfere with operation of either the sleeves 24 or the electronic equipment 11 when accessing or removing and replacing the circuit boards containing the protective circuitry 30.

The test circuitry 32 is operable to provide test pins or similar electrical connections for testing the operation of some or all of the electronic equipment 11. The test circuitry 32 is mounted on the same circuit boards, or "daughter boards", as the protective circuitry 30. Thus, the test pins are also easily accessed through the top of the outer housing 12 with only the lid 18 removed. The test circuitry 32 may include bantam jacks 66 for advantageously facilitating easier interfacing of test equipment with the test circuitry 32.

The base plate 34 includes a plurality of spring-like elements 68 operable to bias the lower leg portions 60 of the sleeves 24 directly against the interior surface of the body 14 of the outer housing 12, thereby improving heat conduction therebetween. The base plate 34 secures to or is otherwise associated with the bottom of the body 14 of the outer housing 12. Each spring-like element 68 has an inwardly projecting tang 70 that guides the lower leg portion 60 of the sleeve 24 as it is inserted between the spring-like element 68 and the interior surface of the body 14. Each spring-like element 68 also has a detent 72 that fits into a corresponding hole 73 on the lower leg portion 60 of a fully inserted sleeve 24 to lock and retain the sleeve 24 in its correct operating position at the bottom of the housing 12. The tang 70 is further operable to provide a means of withdrawing the detent 72 from the hole 73, thereby unlocking the sleeve 20 for removal.

The ground plate 36 is operable to provide a common electrical ground for the electronic equipment 11. The ground plate 36 may include holes 74 or cutouts so as not to overly impede air flow within the outer housing 12.

The spreader plate 38 is operable to physically force the sleeves 24 into direct contact with the interior wall of the outer housing 12, thereby ensuring a direct pathway for thermal conduction from the heat-generating electronic equipment 11 to the outer housing 12 and the ambient environment. As illustrated, the spreader plate 38 is operable to secure to each sleeve 24 using a threaded fastener which may be screwed into holes provided in both the spreader plate 38 and the sleeve 24. Because these holes are slightly offset, screwing the fasteners thereinto causes the holes to align, whereby a portion of the resulting force is operable to force the sleeves 24 into direct contact with the interior surface of the outer housing 12. The spreader plate 38 may also include holes 75 or cutouts so as not to overly impede air flow within the outer housing 12.

Figure 5:
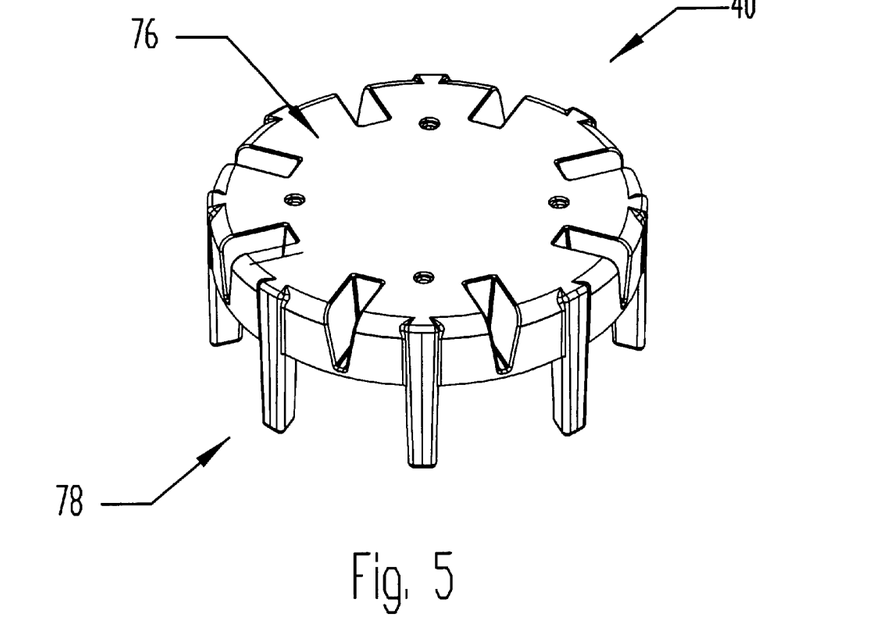
FIG. 5 is an isometric view of a heat sink portion of the present invention.

Referring also to FIG. 5, a heat sink 40 may be included operable to both improve conductive heat transfer between the sleeves 24 and the lid 18 and to aid in retaining the electronic equipment 11 in its proper operating position within the sleeves 24. The heat sink 40 is preferably constructed of aluminum or a material with similar thermal conductivity properties, and includes a substantially planar upper contact surface 76 and a plurality of legs 78 projecting downwardly therefrom. The upper contact surface 76 is secured to or otherwise in direct contact with the interior surface of the lid 18. Each of the legs 78 projects downwardly to substantially contact a respective sleeve 24 or the electronic equipment 11 within the sleeve 24. In operation, the heat sink 40 provides a direct pathway for thermal conductivity between the sleeves 24 or electronic equipment 11 and the lid 18; thus, waste heat generated by the electronic equipment 11 is transferred to the legs 78, or to the sleeves 24 and thereafter to the legs 78, from the legs 78 to the upper contact surface 76 to the lid 18, whereafter it may be radiated into the ambient environment.

Figure 6:
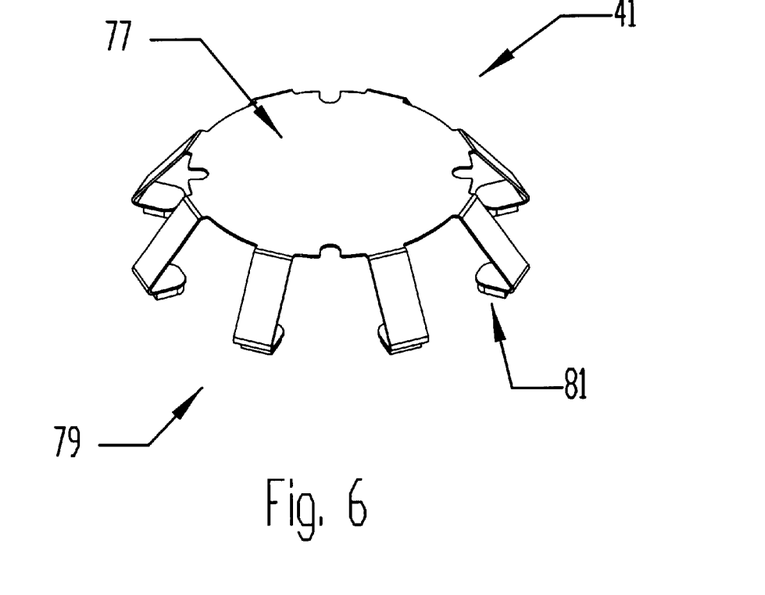
FIG. 6 is an isometric view of a card retainer portion of the present invention.

Referring also to FIG. 6, a card retainer 41 may be included operable to ensure that the electronic equipment does not inadvertently disengage from the sleeves during, for example, movement or rough handling of the equipment enclosure 10. The card retainer 41 may be included as an alternative to or in combination with the heat sink 40. The card retainer 41 includes a body 77 and a plurality of legs 79 secured thereto and projecting downwardly therefrom. The body 77 is secured to the interior surface of the lid 18. Each of the legs 79 projects downwardly when the lid 18 is closed to substantially contact the electronic equipment 11 within a corresponding sleeve 24. The legs 77 may be designed to have flexible spring-like qualities and padded ends 81 so as to facilitate establishing and maintaining the substantial contact without damaging the electronic equipment 11. The card retainer 41, being secured to the lid 18, is removed with the lid 18 such that no additional work is required to remove the electronic equipment 11 from the sleeves 24. The card retainer 41 may be included alternative to or in combination with the heat sink 40.

Figure 7:
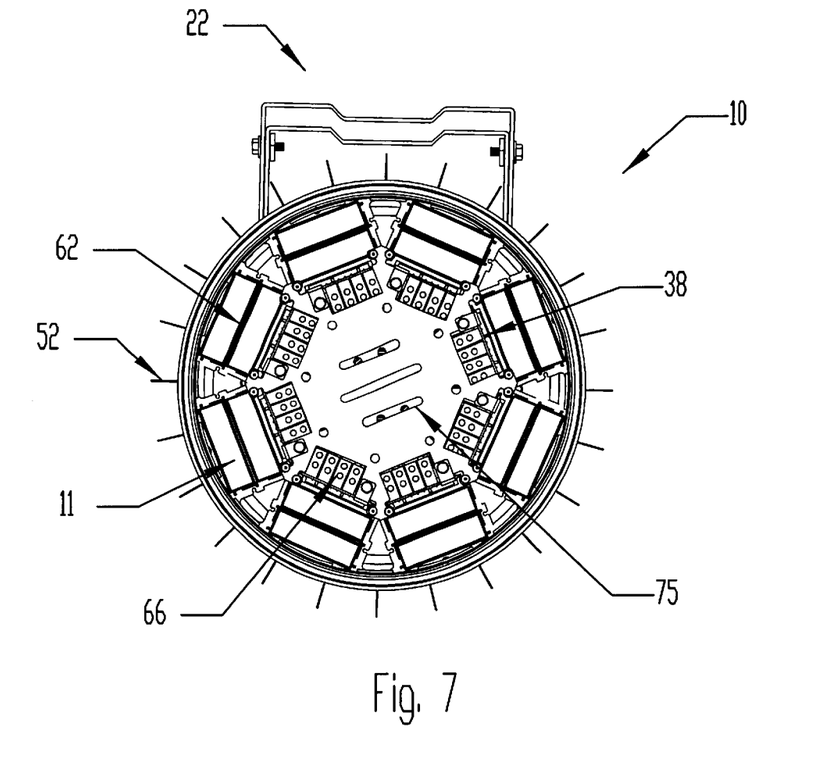
FIG. 7 is a top plan view looking into an open outer housing portion of the embodiment shown in FIG. 1, showing a number of the sleeves arranged about an interior of the outer housing.
Figure 8:
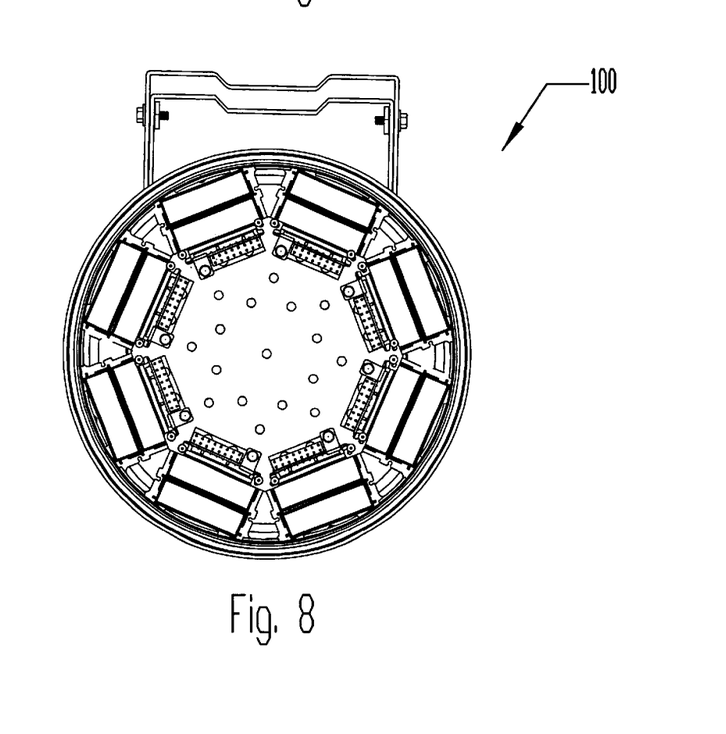
FIG. 8 is a top plan view looking into an open outer housing portion of the embodiment shown in FIG. 2, showing a number of the sleeves arranged about an interior of the outer housing.

In operation, a technician desiring to access the interior of the outer housing 12 of the equipment enclosure 10 may, as desired, tilt the outer housing 12 on the pivot bracket 22 so as to have better access to the ring clamp 50 and lid 18. The technician then removes the lid 18 by expanding and removing the ring clamp 50 in order to uncouple the body 14 from the lid 18 of the outer housing 12. Looking into the open body 14 of the outer housing 12, the technician is presented with the view shown in either FIG. 7 or FIG. 8, depending on the particular embodiment present invention. FIG. 7 corresponds to the embodiment also shown in FIG. 1 which, for example, includes the bantam jacks 66 for easier connection to the test circuitry 32. FIG. 8 corresponds to the embodiment also shown in FIG. 2 which, for example, includes only simple test pin connections for connection to the test circuitry.

Once such access is gained, the electronic equipment 11 may be easily removed from or inserted into the sleeves 24. The sleeves 24 themselves may be removed by first unscrewing and removing the spreader plate 38 and the grounding plate 36. The technician is then able to reach into the housing 12 to depress the tang 70 of the particular spring-like element 68 associated with the sleeve 24 to be removed. Depressing the tang 70 causes the detent 72 to release from the corresponding hole 73 in the leg portion 60 of the sleeve 24, thereby unlocking the sleeve 24 and permitting its removal through the open top of the outer housing 12.

Replacing the sleeve 24 is accomplished by performing the steps of the removal process in reverse order. Note, however, that the step of depressing the tang 70 is unnecessary during replacement of the sleeve 24 as the sleeve's shape will allow it to automatically slip behind the spring-like element 68 and engage the detent as the technician pushes the sleeve 24 into its proper operating position.

As desired, with only the lid 18 removed, the technician may also test the electronic equipment 11, without interfering with the operation thereof, by connecting to the easily accessible test connection 66 provided by the test circuitry 32. Furthermore, again with only the lid 18 removed, the technician may remove and replace the protective circuitry 30, such as may be required after a lightning surge, without interfering with the operation of the electronic equipment 11.

Once finished, the technician replaces all components, including the lid 18 and ring clamp 50, and reorients, as necessary, the equipment enclosure 10 on the pivot bracket 22. Thereafter, as the electronic equipment 11 operates and heat is generated, a first pathway for thermal conductivity to the ambient environment is provided by having the sleeves 24 in direct physical contact with the interior surface of the outer housing 12, as is ensured by use of the spreader plate 38 and the spring-like elements 68 of the base plate 34. Also during operation, the holes 74,75 in both the ground plate 36 and the spreader plate 38 allow for air flow throughout the interior of the outer housing 12, thereby further facilitating natural cooling. A second pathway for thermal conductivity may be provided by the optional heat sink 40 which wicks heat away from the electronic equipment 11 and transfers it to the lid 18 whereafter is may be dissipated into the ambient environment. Additionally, inadvertent disengagement of the electronic equipment 11 from the sleeves 24 may be prevented by the optional card retainer 41.

From the preceding description it will be appreciated that the equipment enclosure 10 of the present invention provides a number of advantages, including the pivot bracket 22 which provides an advantageous ability to pivot the outer housing 12 up to 30° relative to the mounting surface, thereby both facilitating access and allowing for a greater variety of mounting locations and orientations than was possible in the prior art. Furthermore, the feature of separate and distinct transmit and receive terminals 26,28 advantageously maintains minimum cross-talk and interference levels without the requiring that the transmit and receive wires be inconveniently and inefficiently twisted, as was required in the prior art. Additionally, locating the protective circuitry 30 and the test circuitry 32 on daughter boards adjacent the each sleeve 24 so as to be advantageously accessible after removing only the lid 18, unlike the prior art which required that the sleeves be removed or that the operation of the electronic equipment 11 be otherwise interfered with in order to access one or both circuitries 30,32. Additionally, heat dissipation through natural conduction is advantageously improved by the spreader plate, which is operable to force the sleeves into direct contact with the interior wall of the outer housing 12, unlike the prior art which used complex, failure prone, and costly mechanical linkages to provide indirect contact. Heat dissipation is also advantageously improved by the heat sink 40 which facilitates conductive heat transfer between the sleeves 24 and the lid 18.

Although the invention has been described with reference to the preferred embodiments illustrated in the attached drawing figures, it is noted that equivalents may be employed and substitutions made herein without departing from the scope of the invention as recited in the claims. For example, as noted above, the present invention is adaptable, with regard to shape, construction, and other specific features of the equipment enclosure, according to a variety of factors, including, for example, mounting location, operating environment, and the nature of the electronic equipment. Furthermore, although described primary as a housing for telecommunications signal repeater cards, the present invention is adaptable to accommodate a variety of electronic equipment, including signaling equipment such as is used for controlling traffic signals.

Having thus described the preferred embodiment of the invention, what is claimed as new and desired to be protected by Letters Patent includes the following:

1. An electronic equipment enclosure for housing electronic equipment, the electronic equipment enclosure comprising:
    an outer housing having an interior housing surface and having an access opening;
    a removable lid closeably positionable over the access opening, wherein the outer housing and lid cooperate to define an interior compartment; and
    a plurality of sleeves arranged about the interior compartment and operable to receive the electronic equipment, wherein each sleeve is in direct physical contact with the interior surface of the outer housing, thereby providing a pathway for thermal conduction therebetween.

2. The electronic equipment enclosure as set forth in claim 1, wherein the electronic equipment is telecommunications equipment.

3. The electronic equipment enclosure as set forth in claim 1, wherein the electronic equipment is signaling equipment.

4. The electronic equipment enclosure as set forth in claim 1, wherein the outer housing is internally pressurizable.

5. The electronic equipment enclosure as set forth in claim 1, wherein the electronic equipment takes the form of cards and each sleeve includes a slot operable to receive a double-wide card.

6. The electronic equipment enclosure as set forth in claim 5, wherein each slot is dividable so as to be operable to receive two single-wide cards.

7. The electronic equipment enclosure as set forth in claim 1, further comprising a plurality of heat-dissipating fins secured to the outer housing and operable to facilitate heat dissipation into an ambient environment.

8. The electronic equipment enclosure as set forth in claim 1, further comprising a mounting bracket removably coupleable with the outer housing and operable to support the outer housing upon a mounting surface.

9. The electronic equipment enclosure as set forth in claim 8, further comprising a pivot bracket coupleable with the mounting bracket and operable to allow for pivoting the outer housing relative to the mounting surface.

10. The electronic equipment enclosure as set forth in claim 1, further comprising a transmit terminal and a receive terminal associated with each sleeve and the electronic equipment received therein, wherein the transmit terminal is separate and distinct from the receive terminal, with each transmit terminal and each receive terminal being operable to electrically connect the associated electronic equipment to, respectively, a transmit wire and a receive wire.

11. The electronic equipment enclosure as set forth in claim 1, further comprising a protective circuitry associated with each sleeve and the electronic equipment received therein and operable to substantially protect the associated electronic equipment from electrical damage, wherein the protective circuitry is accessible and replaceable by removing only the lid from the outer housing.

12. The electronic equipment enclosure as set forth in claim 1, further comprising a test circuitry associated with each sleeve and the electronic equipment received therein and operable to allow for operational testing of the associated electronic equipment, wherein the test circuitry is accessible and replaceable by removing only the lid from the outer housing.

13. The electronic equipment enclosure as set forth in claim 1, further comprising a base plate operable to force a lower portion of each sleeve into direct physical contact with the interior surface of the outer housing, thereby ensuring a direct pathway for thermal conduction therebetween.

14. The electronic equipment enclosure as set forth in claim 1, further comprising a ground plate electrically connected to each sleeve and operable to provide a common electrical ground therebetween, wherein the ground plate is provided with holes for allowing air flow therethrough.

15. The electronic equipment enclosure as set forth in claim 1, further comprising a card retainer secured to the lid and presenting a plurality of depending legs such that, when the lid is closed, each leg is in physical contact with the electronic equipment received within a respective one of the sleeves.

16. The electronic equipment enclosure as set forth in claim 15, wherein each leg includes a cushioning pad at a point of physical contact between the leg and the electronic equipment.

17. An electronic equipment enclosure for housing electronic equipment, the electronic equipment enclosure comprising:
   an outer housing having an interior housing surface and having an access opening;
   a mounting bracket removably coupleable with the outer housing and operable to support the outer housing upon a mounting surface;
   a pivot bracket coupleable with the mounting bracket and operable to allow for pivoting the outer housing relative to the mounting surface;
   a removable lid closeably positionable over the access opening, wherein the outer housing and lid cooperate to define an interior compartment; and
   a plurality of sleeves arranged about the interior compartment and operable to receive the electronic equipment, wherein each sleeve is in direct physical contact with the interior surface of the outer housing, thereby providing a pathway for thermal conduction therebetween.

18. The electronic equipment enclosure as set forth in claim 17, wherein the electronic equipment is telecommunications equipment.

19. The electronic equipment enclosure as set forth in claim 17, wherein the electronic equipment is signaling equipment.

20. The electronic equipment enclosure as set forth in claim 17, wherein the outer housing is internally pressurizable.

21. The electronic equipment enclosure as set forth in claim 17, wherein the electronic equipment takes the form of cards and each sleeve includes a slot operable to receive a double-wide card.

22. The electronic equipment enclosure as set forth in claim 21, wherein each slot is dividable so as to be operable to receive two single-wide cards.

23. The electronic equipment enclosure as set forth in claim 17, further comprising a plurality of heat dissipating fins secured to the outer housing and operable to facilitate heat dissipation into an ambient environment.

24. The electronic equipment enclosure as set forth in claim 17, further comprising a transmit terminal and a receive terminal associated with each sleeve and the electronic equipment received therein, wherein the transmit terminal is separate and distinct from the receive terminal, with each transmit terminal and each receive terminal being operable to electrically connect the associated electronic equipment to, respectively, a transmit wire and a receive wire.

25. The electronic equipment enclosure as set forth in claim 17, further comprising a protective circuitry associated with each sleeve and the electronic equipment received therein and operable to substantially protect the associated electronic equipment from electrical damage, wherein the protective circuitry is accessible and replaceable after removing only the lid from the outer housing.

26. The electronic equipment enclosure as set forth in claim 17, further comprising a test circuitry associated with each sleeve and the electronic equipment received therein and operable to allow for operational testing of the associated electronic equipment, wherein the test circuitry is accessible and replaceable after removing only the lid from the outer housing.

27. The electronic equipment enclosure as set forth in claim 17, further comprising a base plate operable to force a lower portion of each sleeve into direct physical contact with the interior surface of the outer housing, thereby ensuring a direct pathway for thermal conduction therebetween.

28. The electronic equipment enclosure as set forth in claim 17, further comprising a ground plate electrically connected to each sleeve and operable to provide a common electrical ground therebetween, wherein the ground plate is provided with holes for allowing air flow therethrough.

29. The electronic equipment enclosure as set forth in claim 17, further comprising a card retainer secured to the lid and presenting a plurality of depending legs such that, when the lid is closed, each leg is in physical contact with the electronic equipment received within a respective one of the sleeves.

30. The electronic equipment enclosure as set forth in claim 29, wherein each leg includes a cushioning pad at a point of physical contact between the leg and the electronic equipment.

31. An electronic equipment enclosure for housing electronic equipment, the electronic equipment enclosure comprising:
   an outer housing having an interior housing surface and having an access opening;
   a removable lid closeably positionable over the access opening, wherein the outer housing and lid cooperate to define an interior compartment;

a plurality of sleeves arranged about the interior compartment and operable to receive the electronic equipment, wherein each sleeve is in direct physical contact with the interior surface of the outer housing, thereby providing a pathway for thermal conduction therebetween;

a transmit terminal and a receive terminal associated with each sleeve and the electronic equipment received therein, wherein the transmit terminal is separate and distinct from the receive terminal, with each transmit terminal and receive terminal being operable to electrically connect the associated electronic equipment to, respectively, a transmit wire and a receive wire; and a test circuitry and a protective circuitry associated with each sleeve and the electronic equipment received therein, wherein each test circuitry and each protective circuitry is located on one or more removeable circuit board accessible after removing only the lid from the outer housing.

32. The electronic equipment enclosure as set forth in claim 31, wherein the electronic equipment is telecommunications equipment.

33. The electronic equipment enclosure as set forth in claim 31, wherein the electronic equipment is signaling equipment.

34. The electronic equipment enclosure as set forth in claim 31, wherein the outer housing is internally pressurizable.

35. The electronic equipment enclosure as set forth in claim 31, wherein the electronic equipment takes the form of cards and each sleeve includes a slot operable to receive a double-wide card.

36. The electronic equipment enclosure as set forth in claim 31, wherein each slot is dividable so as to be operable to receive two single-wide cards.

37. The electronic equipment enclosure as set forth in claim 31, wherein the protective circuitry includes a lighting surge protection circuitry.

38. The electronic equipment enclosure as set forth in claim 31, further comprising a plurality of heat dissipating fins secured to the outer housing and operable to facilitate heat dissipation into an ambient environment.

39. The electronic equipment enclosure as set forth in claim 31, further comprising a mounting bracket removably coupleable with the outer housing and operable to support the outer housing upon a mounting surface.

40. The electronic equipment enclosure as set forth in claim 39, further comprising a pivot bracket interposeable between the outer housing and the mounting bracket and operable to allow for pivoting the outer housing relative to the mounting bracket.

41. The electronic equipment enclosure as set forth in claim 31, further comprising a base plate operable to force a lower portion of each sleeve into direct physical contact with the interior surface of the outer housing, thereby ensuring a direct pathway for thermal conduction therebetween.

42. The electronic equipment enclosure as set forth in claim 31, further comprising a ground plate electrically connected to each sleeve and operable to provide a common electrical ground therebetween, wherein the ground plate is provided with holes for allowing air flow therethrough.

43. The electronic equipment enclosure as set forth in claim 31, further comprising a card retainer secured to the lid and presenting a plurality of depending legs such that, when the lid is closed, each leg is in physical contact with the electronic equipment received within a respective one of the sleeves.

44. The electronic equipment enclosure as set forth in claim 43, wherein each leg includes a cushioning pad at a point of physical contact between the leg and the electronic equipment.

45. An electronic equipment enclosure for housing electronic equipment, the electronic equipment enclosure comprising:

an outer housing having an interior housing surface and having an access opening;

a removable lid closeably positionable over the access opening, wherein the outer housing and lid cooperate to define an interior compartment;

a plurality of sleeves arranged about the interior compartment and operable to receive the electronic equipment, wherein each sleeve is in direct physical contact with the interior surface of the outer housing, thereby providing a pathway for thermal conduction therebetween; and a card retainer secured to the lid and presenting a plurality of depending legs such that, when the lid is closed, each leg is in physical contact with the electronic equipment received within a respective one of the sleeves.

46. The electronic equipment enclosure as set forth in claim 45, wherein the electronic equipment is telecommunications equipment.

47. The electronic equipment enclosure as set forth in claim 45, wherein the electronic equipment is signaling equipment.

48. The electronic equipment enclosure as set forth in claim 45, wherein the outer housing is internally pressurizable.

49. The electronic equipment enclosure as set forth in claim 45, wherein the electronic equipment takes the form of cards and each sleeve includes a slot operable to receive a double-wide card.

50. The electronic equipment enclosure as set forth in claim 49, wherein each slot is dividable so as to be operable to receive two single-wide cards.

51. The electronic equipment enclosure as set forth in claim 45, wherein each leg of the card retainer includes a cushioning pad at a point of physical contact between the leg and the electronic equipment.

52. The electronic equipment enclosure as set forth in claim 45, further comprising a plurality of heat dissipating fins secured to the outer housing and operable to facilitate heat dissipation into an ambient environment.

53. The electronic equipment enclosure as set forth in claim 45, further comprising a mounting bracket removably coupleable with the outer housing and operable to support the outer housing upon a mounting surface.

54. The electronic equipment enclosure as set forth in claim 53, further comprising a pivot bracket coupleable with the mounting bracket and operable to allow for pivoting the outer housing relative to the mounting surface.

55. The electronic equipment enclosure as set forth in claim 45, further comprising a transmit terminal and a receive terminal associated with each sleeve and the electronic equipment received therein, wherein the transmit terminal is separate and distinct from the receive terminal, with each transmit terminal and receive terminal being operable to electrically connect the associated electronic equipment to, respectively, a transmit wire and a receive wire.

56. The electronic equipment enclosure as set forth in claim 45, further comprising a protective circuitry associated with each sleeve and the electronic equipment received therein and operable to substantially protect the associated electronic equipment from electrical damage, wherein the protective circuitry is accessible and replaceable by removing only the lid from the outer housing.

57. The electronic equipment enclosure as set forth in claim 45, further comprising a test circuitry associated with each sleeve and the electronic equipment received therein and operable to allow for operational testing of the associated electronic equipment, wherein the test circuitry is accessible and replaceable by removing only the lid from the outer housing.

58. The electronic equipment enclosure as set forth in claim 45, further comprising a base plate operable to force a lower portion of each sleeve into direct physical contact with the interior surface of the outer housing, thereby ensuring a direct pathway for thermal conduction therebetween.

59. The electronic equipment enclosure as set forth in claim 45, further comprising a ground plate electrically connected to each sleeve and operable to provide a common electrical ground therebetween, wherein the ground plate is provided with holes for allowing air flow therethrough.

* * * * *